US012796190B2

(12) United States Patent
Fan

(10) Patent No.: US 12,796,190 B2
(45) Date of Patent: Nov. 10, 2026

(54) DISPLAY UNIT, DISPLAY DEVICE AND MANUFACTURING METHOD

(71) Applicant: XIAMEN EXTREMELY PQ DISPLAY TECHNOLOGY CO., LTD., Xiamen (CN)

(72) Inventor: Yong Fan, Xiamen (CN)

(73) Assignee: XIAMEN EXTREMELY PQ DISPLAY TECHNOLOGY CO., LTD., Xiamen (CN)

( * ) Notice: Subject to any disclaimer, the term of this patent is extended or adjusted under 35 U.S.C. 154(b) by 295 days.

(21) Appl. No.: 18/572,838

(22) PCT Filed: Jan. 7, 2022

(86) PCT No.: PCT/CN2022/070726
§ 371 (c)(1),
(2) Date: Dec. 21, 2023

(87) PCT Pub. No.: WO2023/130355
PCT Pub. Date: Jul. 13, 2023

(65) Prior Publication Data
US 2024/0355976 A1 Oct. 24, 2024

(51) Int. Cl.
*H10H 29/856* (2025.01)
*H10H 20/856* (2025.01)
(Continued)

(52) U.S. Cl.
CPC ........ *H10H 20/856* (2025.01); *H10H 29/856* (2025.01); *H10W 90/00* (2026.01); *H10H 20/0363* (2025.01)

(58) Field of Classification Search
CPC .................................................... H10H 29/856
(Continued)

(56) References Cited

U.S. PATENT DOCUMENTS

2016/0276421 A1 9/2016 Lee
2018/0040633 A1 2/2018 Lee
2020/0227489 A1 * 7/2020 Kim .................... H10K 59/122

FOREIGN PATENT DOCUMENTS

CN 1831590 A 9/2006
CN 109713162 A 5/2019
(Continued)

OTHER PUBLICATIONS

International Search Report in International application No. PCT/CN2022/070726, mailed on Sep. 28, 2022.
(Continued)

*Primary Examiner* — Hsin Yi Hsieh
(74) *Attorney, Agent, or Firm* — Nathan & Associates Patent Agents Ltd.; Menachem Nathan

(57) ABSTRACT

Some embodiments of the present application provide a display unit including: a substrate; a light-emitting device disposed on the substrate; a reflective barrier layer arranged on the substrate. The reflective barrier layer is provided with a light exit hole arranged correspondingly to the light-emitting device. A first projection is defined by an orthographic projection of the light exit hole in a plane vertical to a light-emitting surface of the light-emitting device, and an angle included between a contour line of the first projection corresponding to a side of a peripheral wall of the light exit hole is different from another angle included between another contour line of the first projection corresponding to an opposite side of the peripheral wall of the light exit hole.

20 Claims, 2 Drawing Sheets

(51) Int. Cl.
*H10W 90/00* (2026.01)
*H10H 20/01* (2025.01)

(58) Field of Classification Search
USPC ........................................................ 257/91
See application file for complete search history.

(56) References Cited

FOREIGN PATENT DOCUMENTS

| | | | |
|---|---|---|---|
| CN | 112289899 | A | 1/2021 |
| CN | 111370547 | B | 3/2021 |
| CN | 112885972 | A | 6/2021 |
| CN | 113675247 | A | 11/2021 |

OTHER PUBLICATIONS

Written Opinion of the International Search Authority in International application No. PCT/CN2022/070726, mailed on Sep. 28, 2022.
Patent proposal evaluation opinion form.

* cited by examiner

DISPLAY UNIT, DISPLAY DEVICE AND MANUFACTURING METHOD

CROSS-REFERENCE TO RELATED APPLICATIONS

This application is a continuation of International Application No. PCT/CN2022/070726 filed on Jan. 7, 2022, the disclosure of which is incorporated herein by reference in its entirety.

TECHNICAL FIELD

The present application relates to the technical field of display, in particular to a display unit, a display device and a manufacturing method.

BACKGROUND

Head up display (HUD), also known as head up display system, can project driving information, such as, current speed and navigation, onto windshield glass. As such, drivers can notice important driving information, such as speed and navigation, without lowering or turning their heads as much as possible.

SUMMARY OF THE INVENTION

Technical Problem

In related arts, the HUD has a low display brightness, and fails to provide a clear display in a strong ambient light.

Solutions to the Problem

Technical Solutions

In a first aspect, some embodiments of the present application provide a display unit, comprising: a substrate; a light-emitting device disposed on the substrate; a reflective barrier layer arranged on the substrate, wherein the reflective barrier layer is provided with a light exit hole arranged correspondingly to the light-emitting device, a first projection is defined by an orthographic projection of the light exit hole in a plane vertical to the a light-emitting surface of the light-emitting device, and an angle included between a contour line of the first projection corresponding to a side of a peripheral wall of the light exit hole and the light-emitting surface of the light-emitting device is different from another angle included between another contour line of the first projection corresponding to an opposite side of the peripheral wall of the light exit hole and the light-emitting surface of the light-emitting device.

In some embodiments, the orthographic projections of extensions of the opposite sides of the peripheral wall of the light exit hole in an extension direction of the peripheral wall of the light exit hole on the light-emitting surface of the light-emitting device partially overlaps.

In some embodiments, included angles between contour lines of the first projection corresponding to any opposite sides of the peripheral wall of the light exit hole and the light-emitting surface of the light-emitting device are different.

In some embodiments, a plurality of light-emitting devices and a plurality of light exit holes are provided, and each of the plurality of light exit holes is arranged correspondingly to at least one of the plurality of light-emitting devices.

In some embodiments, a cross-sectional area of the light exit hole gradually increases in a direction away from the substrate.

In some embodiments, the display unit comprises a lens layer disposed on a side of the reflective barrier layer away from the substrate, the lens layer comprises a plurality of lens portions, and the plurality of lens portions is disposed opposite to the light exit holes.

In some embodiments, each of the plurality of lens portion is embedded in the light exit hole.

In some embodiments, the reflective barrier layer comprises a reflective barrier sublayer and a reflective sublayer, the reflective barrier sublayer is disposed on the substrate and comprises the light exit hole, and the reflective sublayer is formed on a circumferential surface of the light exit hole.

In a second aspect, embodiments of the present application provide a display device, comprising the display unit described in any one of the above embodiments.

In a third aspect, embodiments of the present application provide a manufacturing method of a display unit, comprising: disposing a light-emitting device on a substrate; forming a first dielectric layer on a side of the substrate on which the light-emitting device is provided; patterning the first dielectric layer to form a reflective barrier layer with a light exit hole, wherein the light exit hole is arranged corresponding to the light-emitting device, a first projection is defined by an orthographic projection of the light exit hole in a plane vertical to the a light-emitting surface of the light-emitting device, and an angle included between a contour line of the first projection corresponding to a side of a peripheral wall of the light exit hole and the light-emitting surface of the light-emitting device is different from another angle included between another contour line of the first projection corresponding to an opposite side of the peripheral wall of the light exit hole and the light-emitting surface of the light-emitting device.

In some embodiments, the reflective barrier layer comprises a reflective barrier sublayer and a reflective sublayer; patterning the first dielectric layer to form a reflective barrier layer with the light exit hole, comprising: patterning the first dielectric layer to form a reflective barrier sublayer with the light exit hole; forming a second dielectric layer on a side of the substrate provided with the reflective barrier sublayer; patterning the second dielectric layer to form a reflective sublayer covering the circumferential surface of the light exit hole.

In some embodiments, after patterning the first dielectric layer to form a reflective barrier layer with the light exit hole, the manufacturing method comprises: providing a lens layer with at least one lens portion on a side of the reflective barrier layer away from the substrate, and arranging the lens portion and the light exit hole oppositely.

BENEFICIAL EFFECTS OF INVENTION

Beneficial Effects

Some embodiments of the application provide the substrate, the light-emitting device and the reflective barrier layer, the reflective barrier layer is provided with a light exit hole arranged correspondingly to the light-emitting device, and light emitted by the light-emitting devices can exit through the light exit holes; Among the lights emitted by the light-emitting device along different angles, light of partial angles can be directly emitted to a side of the reflective barrier layer away from the substrate along the light exit channel defined by the hollow part, and light irradiated on the circumferential surface of the hollow part is reflected by the region of the reflective barrier layer located in the hollow part, and then emitted to one side of the reflective barrier layer away from the substrate along the light exit channel defined by the hollow part, all or at least most of the light emitted by the light-emitting device is emitted more intensively along the light exit channel defined by the hollow part, the utilization rate of the light emitted by the light-emitting device is higher, the light-emitting intensity and the display brightness of the display unit can be improved, and the display information can still be clearly displayed under high ambient brightness conditions; a first projection is defined by an orthographic projection of the light exit hole in a plane vertical to the a light-emitting surface of the light-emitting device, and an angle included between a contour line of the first projection corresponding to a side of a peripheral wall of the light exit hole and the light-emitting surface of the light-emitting device is different from another angle included between another contour line of the first projection corresponding to an opposite side of the peripheral wall of the light exit hole and the light-emitting surface of the light-emitting device, and the included angles between contour lines on opposite sides of a peripheral wall of the light exit hole on the first projection and the light-emitting surface of the light-emitting device can be set by the light exit hole, so that light emitted by the light-emitting device is emitted more intensively along a preset direction and from a preset side, such that the amount of light emitted is concentrated within a desired specific viewing angle range to satisfy the display requirements of application occasions with specific viewing angles, such as HUD.

BRIEF DESCRIPTION OF THE DRAWINGS

Description of the Drawings

In order to more clearly explain the technical solutions in the embodiments of the present application, the drawings required for the description of the embodiments will be briefly introduced below. It should be understood, the drawings in the description below are only some embodiments of the present application, for those skilled in the art, other drawings can be obtained according to these drawings without any creative effort.

Figure 1:
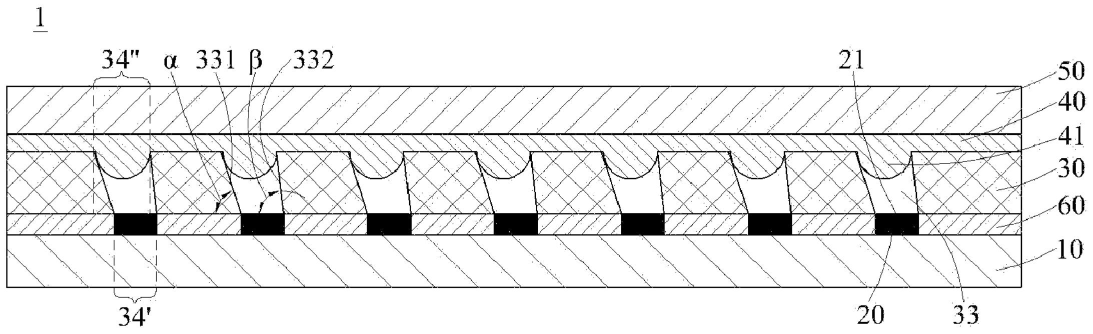
Figure 2:
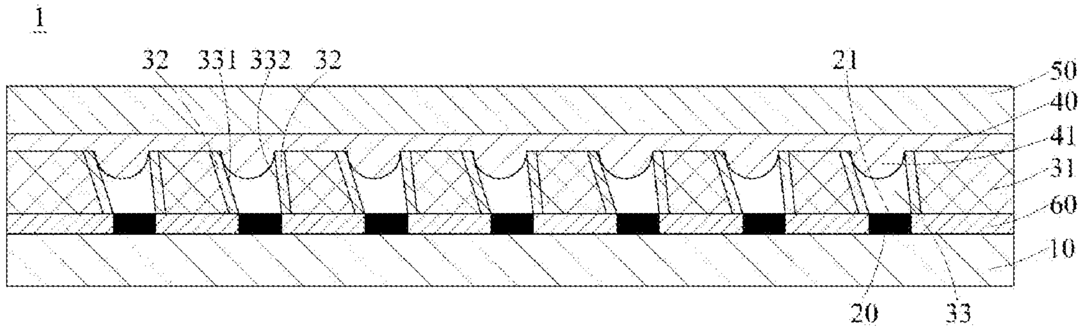
Figure 3:
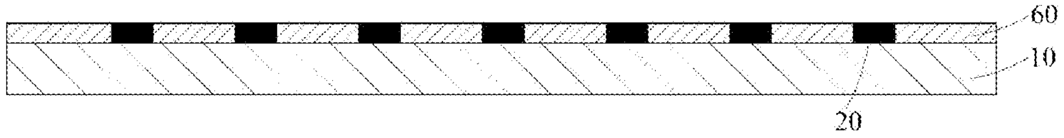
Figure 4:
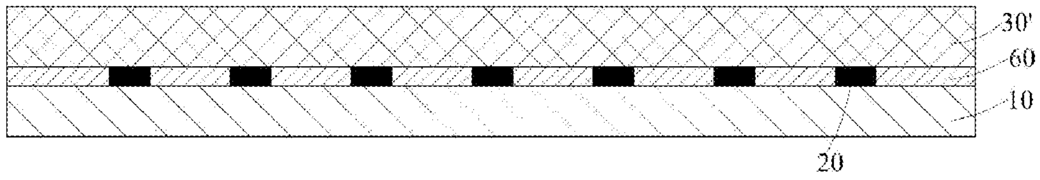
Figure 5:
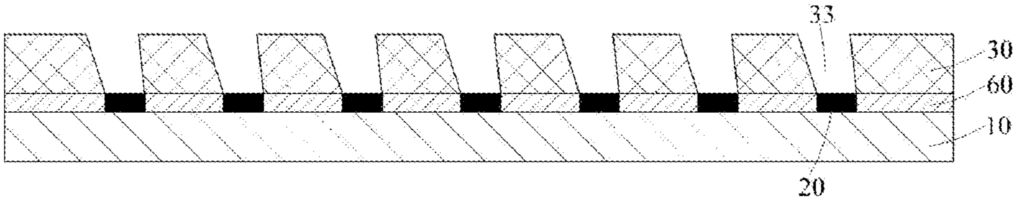
Figure 6:
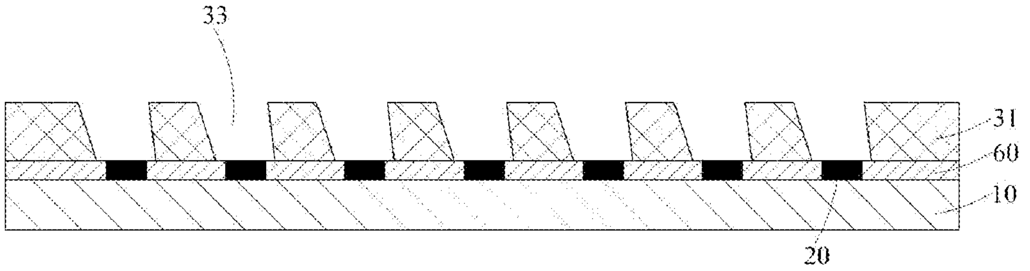
Figure 7:
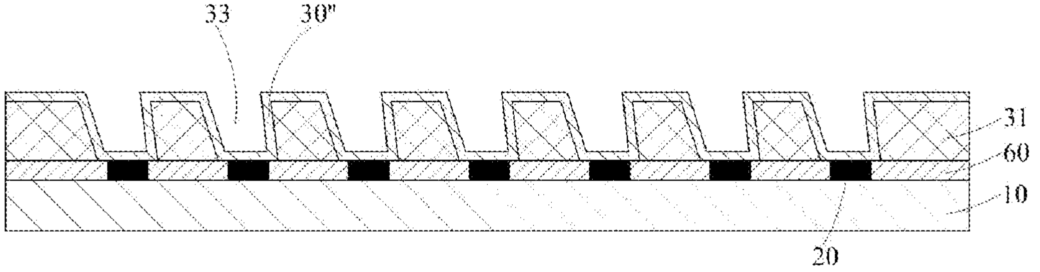
Figure 8:
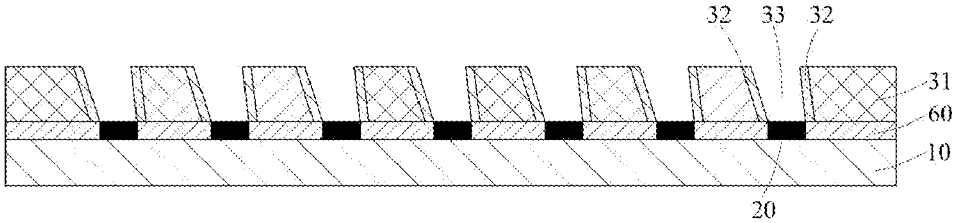
Figure 9:
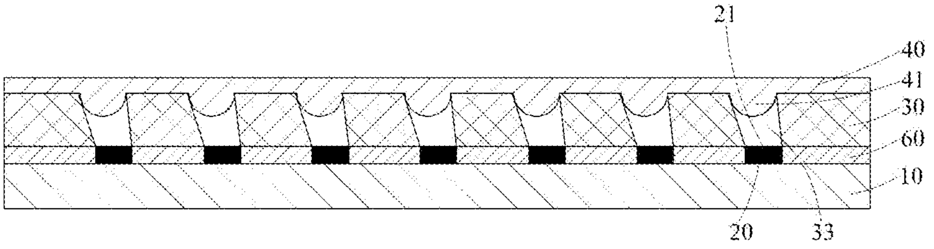

FIG. 1 is a sectional structural diagram of a display unit according to some embodiments of the present application;

FIG. 2 is a sectional structure diagram of another structure of a display unit according to some embodiments of the present application;

FIG. 3 is a process diagram of providing a light-emitting device in a manufacturing method of a display unit according to some embodiments of the present application;

FIG. 4 is a process diagram of forming a first dielectric layer according to a manufacturing method of a display unit according to some embodiments of the present application;

FIG. 5 is a process diagram of forming a reflective barrier layer according to a manufacturing method of a display unit according to some embodiments of the present application;

FIG. 6 is a process diagram of forming a reflective barrier sublayer according to a manufacturing method of a display unit according to some embodiments of the present application;

FIG. 7 is a process diagram of forming a second dielectric layer according to a manufacturing method of a display unit according to some embodiments of the present application;

FIG. 8 is a process diagram of forming a reflective sublayer according to a manufacturing method of a display unit according to some embodiments of the present application;

FIG. 9 is a process diagram of forming a lens layer according to a manufacturing method of a display unit according to some embodiments of the present application.

REFERENCE NUMERAL

1—display unit, 10—substrate, 20—light-emitting device, 21—light-emitting surface, 30—reflective barrier layer, 31—reflective barrier sublayer, 32—reflective sublayer, 33—light-emitting hole, 331—first side contour line, 332—second side contour line, 34'—first orthographic projection, 34"—second orthographic projection, 30'—first dielectric layer, 30"—second dielectric layer, 40—lens layer, 41—lens portion, 50—transparent cover plate, 60—OCA optical glue, α—first angle, β—second angle.

EMBODIMENT OF THE INVENTION

Detailed Description of the Preferred Embodiments

The technical solutions in the embodiments of the present application will be clearly and completely described below in combination with the drawings of the present application. It should be understood, the described embodiments are only a part of the embodiments of the present application, not all of the embodiments. Based on the embodiments in the present application, all other embodiments obtained by a person skilled in the art without creative effort fall within the protection scope of the present application.

In the description of the present application, it should be understood that the orientation or positional relationship indicated by the terms "center", "longitudinal", "lateral", "length", "width", "thickness", "upper", "lower", "front", "rear", "left", "right", "vertical", "horizontal", "top", "bottom", "inner", "outer", etc. is based on the orientation or positional relationship shown in the accompanying drawings only for convenience and simplicity of description of the present application, not for indicating or implying that the indicated device or element must have a particular azimuth, be constructed and operated in a particular azimuth, and therefore is not to be construed as limiting of the present application. Furthermore, the terms "first" and "second" are used for descriptive purposes only and are not to be construed as indicating or implying relative importance or implicitly indicating the number of indicated technical features. Thus, a feature defined by "first" and "second" may explicitly or implicitly include one or more of said features. In the description of the present application, "plurality" means two or more, unless otherwise specifically defined.

"A and/or B" includes the following three combinations: A, B, and a combination of A and B.

The use of "adapted for" or "configured to" in this application means open and inclusive language that does not exclude devices adapted for or configured to perform additional tasks or steps. Additionally, the use of "based on" is meant to be open and inclusive, in that a process, step, calculation, or other action "based on" one or more of the stated conditions or values may in practice be based on additional conditions or values beyond those stated.

In this application, that word "exemplarily" is use to mean "serving as an example or illustration.", any embodiments described in this application as "exemplarily" is not necessarily to be construed as preferred or advantageous over other embodiments. To enable those skilled in the art to implement and use the application, the following description is presented. In the following description, details are set forth for purposes of explanation. It should be appreciated by those skilled in the art that the present application could also be practiced without these specific details. In other embodiments, well-known structures and procedures have not been described in detail so as not to obscure the description of the present application in unnecessary detail. Thus, the application is not intended to be limited to the embodiments shown, but is to be accorded the widest scope consistent with the principles and features disclosed herein.

In related arts, HUD mostly adopts liquid crystal on silicon (LCOS) or digital light processing (DLP) display technology, and the display brightness is low. With strong ambient light, such as during daytime driving, the driving information projected by the HUD has low brightness and insufficient contrast, which cannot be clearly displayed to the driver. As such, the HUD has a low environmental adaptability, and the safety risk of driving is increased.

As shown in FIG. 1, in a first aspect, some embodiments of the present application provide a display unit 1. The display unit 1 includes a substrate 10, and a light-emitting device 20, and a reflective barrier layer 30 respectively disposed on the substrate 10. The display unit can display information with high brightness at a desired viewing angle to meet the requirement of head up display when ambient light is strong.

Here, the type of the substrate 10 can be determined according to actual needs, such as a glass substrate 10, a flexible substrate 10, and the like, which is not limited in some embodiments of the present application. The type of the light-emitting device 20 can be determined according to actual needs, such as Micro LED, Mini LED, and the like, which is not limited in the embodiments of the present application.

The reflective barrier layer 30 is provided with a light exit hole 33 penetrating there through, and the light exit hole 33 penetrates through opposite side surfaces of the reflective barrier layer 30 along the thickness direction thereof. The light exit hole 33 is arranged correspondingly to the light-emitting device 20, and a light exit channel of the light-emitting device 20 is defined by the light exit hole 33, so that the light emitted by the light-emitting device 20 can be emitted to the outside of the display unit 1 through the light exit hole 33.

Here, the reflective barrier layer 30 has a high reflectivity to the light emitted from the light-emitting device 20. For the light emitted from the light-emitting device 20 along different angles, a portion of the light at a specific angle can be directly emitted to the side of the reflective barrier layer 30 away from the substrate 10 along the light exit channel defined by the light exit hole 33, a portion of the light at other angles may irradiate the circumferential surface of the light exit hole 33 and is reflected by the region of the reflective barrier layer 30 located in the light exit hole 33. As such, at least most of the light cannot be transmitted, escaped or absorbed from the reflective barrier layer 30, but is emitted to the side of the reflective barrier layer 30 away from the substrate 10 along the light exit channel defined by the light exit hole 33 after being reflected once or multiple times in the light exit hole 33. In this way, all or at least most of the light emitted from the light-emitting device 20 is emitted relatively intensively along the light exit channel defined by the light exit hole 33, and the utilization ratio of the light emitted from the light-emitting device 20 and the light exit intensity of the display unit 1 is increased.

Here, a first projection is defined by an orthographic projection of the light exit hole 33 in a plane (hereinafter referred to as a first plane) perpendicular to the light-emitting surface of the light-emitting device 20, and contour lines of the first projection corresponding to opposite sides of the peripheral wall of the light exit hole are referred to as a first side contour line 331 and a second side contour line 332, respectively. The first side contour line 331 and the second side contour line 332 respectively correspond to two side regions (hereinafter referred to as a first side region and a second side region) disposed opposite to each other on the peripheral wall of the light exit hole 33, and are formed by orthographic projections of these two side regions in the first plane. Depending on the shape of the peripheral wall of the light exit hole 33, the first side region can be a plane region or a line region; similarly, the second side region can be a plane region or a line region. A first angel $\alpha$ is included between the first side contour line 331 and the light-emitting surface of the light-emitting device 20, and a second angle $\beta$ is included between the second side contour line 332 and the light-emitting surface of the light-emitting device 20 is the, wherein the first angle $\alpha$ and the second angle $\beta$ are different. Accordingly, the region corresponding to the first projection in the light exit channel is biased toward one of the first side region and the second side region, so that the amount of light emitted from the first side region and the amount of light emitted from the second side region are different. In this way, the first angle $\alpha$ and the second angle $\beta$ can be set so that the light emitted from the light-emitting device 20 is relatively concentrated in the preset direction and is emitted from the preset side. Thus, the amount of light emitted is concentrated within the required specific viewing angle range, and the display requirement of the required specific viewing angle is met. Exemplarily, the light-emitting surface 21 of the light-emitting device 20 can be disposed parallel to the surface of the substrate 10; accordingly, the first angle $\alpha$ is included between the first side contour line 331 and the surface of the substrate 10, and the second angle $\beta$ is included between the second side contour line 332 and the surface of the substrate 10.

In the display unit 1 provided by some embodiments of the present application, on the one hand, all or at least most of the light emitted by the light-emitting device 20 is emitted intensively along the light exit channel defined by the light exit hole 33, and the utilization rate of the light emitted by the light-emitting device 20 is relatively high, so that the light-emitting intensity and brightness of the display unit 1 can be improved; on the other hand, the included angles between contour lines of the first projection corresponding to opposite sides of the peripheral wall of the light exit hole 33 and the light-emitting surface of the light-emitting device 20 are different, so that the intensively emitted light can be distributed within the required specific viewing angle range to meet the display requirements of the specific viewing angle. Compared with related arts, when the display unit 1 provided by some embodiments of the present application is applied to display occasions with specific viewing angle requirements such as HUD, the display unit 1 has high display brightness, and can clearly display driving information under high ambient brightness conditions, and the driving information can be clearly identified by the driver, thereby increasing the adaptability to the environment and reducing the safety risk in the driving process.

Here, the light-emitting device 20 and the reflective barrier layer 30 can be provided in different structural forms. In some embodiments, a plurality of light-emitting devices 20 are provided, the light-emitting devices 20 can be adhered to the substrate 10 by an optically clear adhesive (OCA) 60, and gaps between adjacent light-emitting devices 20 can be filled by the OCA 60, thereby forming a flat light-emitting layer structure; accordingly, the reflective barrier layer 30 can be formed on a side of the light-emitting layer structure away from the substrate 10. In other embodiments, the light-emitting device 20 can be adhered to the substrate 10 through the OCA optical adhesive 60, the reflective barrier layer 30 can be directly formed on the substrate 10, and the light-emitting device 20 is correspondingly disposed in the light-emitting hole 33.

The specific settings of the first angle α and the second angle β can be determined according to actual needs, which are not limited in the embodiments of the present application. In some embodiments, orthographic projections of openings of the light exit hole 33 at the opposite sides in an extension direction of the light exit hole on the light-emitting surface of the light-emitting device 20 are partially overlapped. Here, an opening of the light exit hole 33 at the side close to the substrate 10 along the extending direction of the light exit hole is referred as a first end opening, an opening of the light exit hole 33 at the opposite side away from the substrate 10 along the extending direction of the light exit hole is referred as a second end opening. Accordingly, an orthographic projection of the first end opening on the light-emitting surface of the light-emitting device 20 is referred as a first orthographic projection 34', and an orthographic projection of the second end opening on the light-emitting surface of the light-emitting device 20 is referred as a second orthographic projection 34". The first orthographic projection 34' and the second orthographic projection 34" are partially overlapped, that is, partial regions of the first orthographic projection 34' is overlapped with partial regions of the second orthographic projection 34", while other regions of the first orthographic projection 34' is not overlapped with other regions of the second orthographic projection 34". In this way, the first side contour line 331 and the second side contour line 332 can be inclined to each other, so that the light exit channel defined by the light exit hole 33 is inclined as a whole to one of the first side area and the second side area to be more in accordance with a specific viewing angle to be displayed. Accordingly, the amount of light emitted from the light exit hole 33 can be further concentrated within a desired specific viewing angle range, and the light emission intensity and display brightness is increased during display in the desired specific viewing angle range, and a clear display is obtained in the strong ambient light.

In some embodiments, included angles between contour lines of the first projection corresponding to any opposite sides of the peripheral wall of the light exit hole and the light-emitting surface of the light-emitting device are different. In this way, the amount of light emitted from any two opposite side regions of the peripheral wall of the light exit hole 33 is different, so that the light emitted from the light-emitting device 20 is emitted intensively from the preset side along the preset direction, so that the amount of light emitted is concentrated within the desired specific viewing angle range, and the display requirement of the desired specific viewing angle can be satisfied.

The number of the light exit holes 33 and the light-emitting devices 20 can be determined according to actual needs, which is not limited in the embodiments of the present application. In some embodiments, a plurality of light-emitting devices 20 and a plurality of light exit holes 33 are provided. The plurality of light exit holes 33 can be arrayed in the reflective barrier layer 30, and the plurality of light-emitting devices 20 can be arrayed on the substrate 10. Here, each light exit hole 33 is provided with at least one light-emitting device 20 inside, so as to ensure that each light exit hole 33 can normally emit light with high brightness.

The structure of the light exit hole 33 can be determined according to actual needs, and various hole structures with different shapes can be adopted, which is not limited in the embodiments of the present application. In some embodiments, the cross-sectional area of the light exit hole 33 gradually increases in a direction away from the substrate 10. Here, the cross-section of the light exit hole 33, that is, the section for the light passing, is obtained by cutting the light exit hole 33 with a plane parallel to the light-emitting surface of the light-emitting device 20. Accordingly, an end of the light exit hole 33 close to the substrate 10 has a smaller section for the light passing, and an end of the light exit hole 33 away from the substrate 10 has a larger section for the light passing. Thus, the light exit hole 33 can guide and diffuse the light emitted from the light-emitting device 20, so that the light emitted from the light exit hole 33 can cover a desired area.

The structure of the reflective barrier layer 30 can be determined according to actual needs, which is not limited in the embodiments of the present application. As shown in FIG. 1, in some embodiments, the reflective barrier layer 30 has a single-layer structure made of a material with a relatively high reflectivity to light emitted from the light-emitting device 20 and a relatively significant reflection effect.

As shown in FIG. 2, in other embodiments, the reflective barrier layer 30 has a multi-layer structure including a reflective barrier sublayer 31 and a light reflecting sub-layer 32. The reflective barrier sublayer 31 is disposed on the substrate 10 and has the aforementioned light exit hole 33, and the reflective sublayer 32 is formed on a circumferential surface of the light exit hole 33. Here, the reflective barrier sublayer 31 can be made of a material with a relatively high reflectivity and a relatively significant reflection effect on light emitted from the light-emitting device 20, or can be made of a material with a relatively insignificant reflection effect on light emitted from the light-emitting device 20 and capable of transmitting a relatively large amount of light, which is not limited in the embodiments of the present application. The light reflective sublayer 32 can be made of a material with a relatively high reflectivity for light emitted from the light-emitting device 20 and a relatively significant reflection effect. In this way, when the light irradiates the circumferential surface of the light exit hole 33, the light can be reflected by the light reflective sublayer 32, so that at least most of the light cannot be transmitted, escaped or absorbed from the reflective barrier layer 30, but is emitted to the side of the reflective barrier layer 30 away from the substrate 10 along the light exit channel defined by the light exit hole 33 after one or more reflections in the light exit hole 33.

In some embodiments, the display unit 1 may further include a lens layer 40 disposed on a side of the reflective barrier layer 30 away from the substrate 10. The lens layer 40 has a plurality of lens portions 41, and each of the lens portions 41 is disposed opposite to the light exit hole 33. The lens portion 41 can focus and converge the light emitted along the light exit hole 33, so that the display light of the display unit 1 can be further concentrated in a desired display area, and the light intensity and contrast of the display area can be increased, which is convenient for the user to observe.

The position of the lens portion 41 on the lens layer 40 can be determined according to actual needs, and is not limited in the embodiments of the present application. In some examples, the lens portion 41 can be formed at a side of the lens layer 40 facing the light-emitting device 20, and the lens portion 41 is embedded in the light exit hole 33. In this way, the lens portion 41 may protrude from the surface of the lens layer 40 facing the light-emitting device 20 and be closely embedded in the light exit hole 33, so that the lens layer 40 and the reflective barrier layer 30 can be closely attached on one hand, and the lens portion 41 can better cover the light-emitting region of the light exit hole 33 on the other hand. Thus, more light emitted from the light exit hole 33 is condensed through the lens portion 41.

As shown in FIGS. 1 to 2, in some embodiments, the display unit 1 may further include a transparent cover plate 50. The transparent cover plate 50 can be disposed on a side of the lens layer 40 away from the reflective barrier layer 30 to structurally support the lens layer 40 and structurally protect the reflective barrier layer 30 and the light-emitting device 20.

As shown in FIGS. 1 to 2, in a second aspect, embodiments of the present application provide a display device, comprising the display unit 1 of any one of the above embodiments. The type of the display device can be determined according to actual needs, such as a head-up display device, a laser projector, a flat-panel TV, etc., which is not limited in the embodiments of the present application. Correspondingly, the display device may include corresponding structures of corresponding device types, which are not repeated here. The display device provided by the embodiments of the present application includes an aforementioned display unit 1, and can display images with high brightness at a specific viewing angle, so as to meet the clear display requirement of the specific viewing angle.

In a third aspect, some embodiments of the present application provide a manufacturing method of display unit, which can be used to manufacture the display unit 1 provided in any of the above embodiments, and the manufacturing method includes steps S10-S30.

In S10, as shown in FIG. 3, a light-emitting device 20 is provided on a substrate 10. Here, the light-emitting device 20 can be adhered to a side surface of the substrate 10 by an OCA 60.

S20: as shown in FIG. 4, forming a first dielectric layer 30' on a side of the substrate 10 provided with the light-emitting device 20.

S30: as shown in FIG. 5, patterning the first dielectric layer 30' to form a reflective barrier layer 30 with a light exit hole 33, wherein the light exit hole 33 is disposed correspondingly to the light-emitting device 20, an angle included between a contour line of the first projection corresponding to a side of a peripheral wall of the light exit hole and the light-emitting surface of the light-emitting device is different from another angle included between another contour line of the first projection corresponding to an opposite side of the peripheral wall of the light exit hole and the light-emitting surface of the light-emitting device. Here, the material of the first dielectric layer 30' and the material of the corresponding region of the light-emitting device 20 can be removed by a material removal process such as film etching, laser removal, etc., thereby forming the corresponding light exit hole 33.

In some embodiments, the reflective barrier layer 30 has a multi-layer structure including a reflective barrier sublayer 31 and a reflective sublayer 32. Accordingly, S30 includes S31 to S33.

S31: as shown in FIG. 6, patterning the first dielectric layer 30' to form a reflective barrier sublayer 31 with light exit holes 33.

S32: as shown in FIG. 7, forming a second dielectric layer 30" on a side of the substrate 10 provided with the reflective barrier sublayer 31.

S33: as shown in FIG. 8, patterning the second dielectric layer 30" to form a reflective sublayer 32 covering the circumferential surface of the light exit hole 33.

In some embodiments, after S30, the manufacturing method further includes S40.

S40: as shown in FIG. 9, a lens layer 40 with a plurality of lens portions 41 is provided on a side of the reflective barrier layer 30 away from the substrate 10, and each of the lens portions 41 is disposed opposite to the light exit hole 33.

In some examples, after S40, the manufacturing method further includes S50.

S50: as shown in FIG. 1, a transparent cover plate 50 is disposed on a side of the lens layer 40 away from the reflective barrier layer 30.

The display unit, the device and the manufacturing method provided by the embodiments of the present application are described in detail above, and the principles and implementation modes of the present application are explained by applying specific examples herein. The description of the above embodiments is only used to help understand the method and the core idea of the present application; meanwhile, for those skilled in the art, the specific implementation mode and application scope can be changed according to the idea of the present application. In summary, the contents of the present description should not be construed as limiting the present application.

What is claimed is:

1. A display unit, comprising:

a substrate;

a light-emitting device disposed on the substrate; and a reflective barrier layer arranged on the substrate, wherein the reflective barrier layer is provided with a light exit hole arranged correspondingly to the light-emitting device, a first projection is defined by an orthographic projection of the light exit hole in a plane vertical to a light-emitting surface of the light-emitting device, and an angle included between a contour line of the first projection corresponding to a side of a peripheral wall of the light exit hole and the light-emitting surface of the light-emitting device of less than 90 degrees is different from another angle included between another contour line of the first projection corresponding to an opposite side of the peripheral wall of the light exit hole and the light-emitting surface of the light-emitting device of less than 90 degrees.

2. The display unit of claim 1, wherein orthographic projections of openings of the light exit hole at opposite sides in an extension direction of the light exit hole on the light-emitting surface of the light-emitting device are partially overlapped.

3. The display unit of claim 1, wherein included angles between contour lines of the first projection corresponding to any opposite sides of the peripheral wall of the light exit hole and the light-emitting surface of the light-emitting device are different.

4. The display unit of claim 1, wherein a plurality of light-emitting devices and a plurality of light exit holes are provided, and each of the plurality of light exit holes is arranged correspondingly to at least one of the plurality of light-emitting devices.

5. The display unit of claim 1, wherein a cross-sectional area of the light exit hole gradually increases in a direction away from the substrate.

6. The display unit of claim 1, comprising a lens layer disposed on a side of the reflective barrier layer away from the substrate, the lens layer comprises a plurality of lens portions, and each of the plurality of lens portions is disposed opposite to the light exit hole.

7. The display unit of claim 6, wherein the lens portion is embedded in the light exit hole.

8. The display unit of claim 1, wherein the reflective barrier layer comprises a reflective barrier sublayer and a reflective sublayer, the reflective barrier sublayer is disposed on the substrate and comprises the light exit hole, and the reflective sublayer is formed on a circumferential surface of the light exit hole.

9. A display device, comprising the display unit of claim 1.

10. A manufacturing method of display unit, comprising:
disposing a light-emitting device on a substrate;
forming a first dielectric layer on a side of the substrate provided with the light-emitting device; and
patterning the first dielectric layer to form a reflective barrier layer with a light exit hole, wherein the light exit hole is arranged corresponding to the light-emitting device, a first projection is defined by an orthographic projection of the light exit hole in a plane vertical to a light-emitting surface of the light-emitting device, an angle included between a contour line of the first projection corresponding to a side of a peripheral wall of the light exit hole and the light-emitting surface of the light-emitting device of less than 90 degrees is is different from another angle included between another contour line of the first projection corresponding to an opposite side of the peripheral wall of the light exit hole and the light-emitting surface of the light-emitting device of less than 90 degrees.

11. The manufacturing method of claim 10, wherein the reflective barrier layer comprises a reflective barrier sublayer and a reflective sublayer; and the patterning the first dielectric layer to form the reflective barrier layer with the light exit hole comprises:
patterning the first dielectric layer to form the reflective barrier sublayer with the light exit hole;
forming a second dielectric layer on a side of the substrate provided with the reflective barrier sublayer; and
patterning the second dielectric layer to form the reflective sublayer covering a circumferential surface of the light exit hole.

12. The manufacturing method of claim 10, after the patterning the first dielectric layer to form the reflective barrier layer with the light exit hole, the manufacturing method comprises:
providing a lens layer with at least one lens portion on a side of the reflective barrier layer away from the substrate, and
arranging the lens portion and the light exit hole oppositely.

13. A display device of claim 9, wherein orthographic projections of openings of the light exit hole at opposite sides in an extension direction of the light exit hole on the light-emitting surface of the light-emitting device are partially overlapped.

14. A display device of claim 9, wherein included angles between contour lines of the first projection corresponding to any opposite sides of the peripheral wall of the light exit hole and the light-emitting surface of the light-emitting device are different.

15. A display device of claim 9, wherein a plurality of light-emitting devices and a plurality of light exit holes are provided, and each of the plurality of light exit holes is arranged correspondingly to at least one of the plurality of light-emitting devices.

16. A display device of claim 9, wherein a cross-sectional area of the light exit hole gradually increases in a direction away from the substrate.

17. A display device of claim 9, comprising a lens layer disposed on a side of the reflective barrier layer away from the substrate, the lens layer comprises a plurality of lens portions, and each of the plurality of lens portions is disposed opposite to the light exit hole.

18. A display device of claim 17, wherein the lens portion is embedded in the light exit hole.

19. A display device of claim 9, wherein the reflective barrier layer comprises a reflective barrier sublayer and a reflective sublayer, the reflective barrier sublayer is disposed on the substrate and comprises the light exit hole, and the reflective sublayer is formed on a circumferential surface of the light exit hole.

20. The display unit of claim 1, wherein the light-emitting device is adhered to the substrate by an optically clear adhesive, and gaps between adjacent light-emitting devices can be filled by the optically clear adhesive to form a flat light-emitting layer structure.

* * * * *